United States Patent
Ott (12)

(10) Patent No.: US 6,400,728 B1
(45) Date of Patent: Jun. 4, 2002

(54) METHOD AND SYSTEM FOR DETECTING USER DATA TYPES IN DIGITAL COMMUNICATIONS CHANNELS AND OPTIMIZING ENCODING-ERROR CORRECTION IN RESPONSE THERETO

(75) Inventor: Stefan Ott, Munich (DE)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/150,505

(22) Filed: Sep. 9, 1998

(51) Int. Cl.[7] .......................... H04B 7/00; H03M 13/00; H04J 3/22; H04Q 7/20
(52) U.S. Cl. ....................... 370/465; 370/310; 714/746; 714/774; 455/426
(58) Field of Search .................. 370/310, 265, 370/311, 464, 465, 487; 714/748, 746, 774, 751, 755–756, 784, 48, 100; 379/88.07, 88.13; 455/3.01, 3.06, 574, 426

(56) References Cited

U.S. PATENT DOCUMENTS 4,654,853 A  *  3/1987 Moriyama et al. .......... 714/774
6,166,667 A  * 12/2000 Park ........................... 714/755
6,182,264 B1 *  1/2001 Ott .............................. 714/774

* cited by examiner

Primary Examiner—Wellington Chin
Assistant Examiner—Maikhanh Tran
(74) Attorney, Agent, or Firm—Wagner, Murabito & Hao LLP

(57) ABSTRACT

A dynamic error correction system for a digital data transmission system. A transmitter adapted to encode user data into a signal is included within the system. A receiver receives the signal and decodes the user data encoded thereon. The signal is transmitted from the transmitter to the receiver via a communications channel. A data type detector is coupled to the transmitter. The data type detector is adapted to detect a data type of the user data being coupled to the transmitter for transmission via the communications channel. A processor is coupled to the transmitter and is adapted to implement at least a first error correction process and a second error correction process for the transmitter, wherein the second error correction process is of a higher capability than the first error correction process. The processor is coupled to receive the data type from the data type detector and dynamically select the first error correction process or the second error correction process in response thereto such that error correction employed by the transmitter is best suited to the data type of the user data.

26 Claims, 3 Drawing Sheets

METHOD AND SYSTEM FOR DETECTING USER DATA TYPES IN DIGITAL COMMUNICATIONS CHANNELS AND OPTIMIZING ENCODING-ERROR CORRECTION IN RESPONSE THERETO

TECHNICAL FIELD

The present invention relates generally to digital information systems. More particularly, the present invention relates to digital enhanced cordless telephony (DECT), and other error-prone digital data transmission systems.

BACKGROUND ART

The transmission of digital information and data between systems has become an essential part of commonly used systems. With such systems, information content is transmitted and received in digital form as opposed to analog form. Information long associated with analog transmission techniques, for example, television, telephone, music, and other forms of audio and video, are now being transmitted and received in digital form. The digital form of the information allows signal processing techniques not practical with analog signals. In most applications, the user has no perception of the digital nature of the information being received.

Many digital communication devices (particularly wireless digital telephones) suffer some amount of signal degradation during the transmission from the originating device to the receiving device. This degradation often results in the loss of some information, some distortion in the signal, or some noticeable noise in the received signal (e.g., as in the case of a wireless telephone). Generally, the more frequent the errors, the more significant the loss of information at the receiving device, which consequently leads to more objectionable performance of the communications system.

To correct this problem, the electronics industry has adopted various error correction techniques which counteract the effects of signal degradation and improve or ensure the integrity of the information at the receiving device. Hence, many digital communications systems available on the market use error correction methods that are each able to accomplish reasonable communication quality under normal operating conditions.

Typically, error correction techniques function by including additional amounts of "redundant" information in the signal transmission from the originating device. This redundant information is often referred to as error correction code. The redundant information is used to check the validity of the information as received at the receiving device. For example, parity checking, check summing, cyclic redundancy checking, forward error correction coding, are several of the more widely used, well known error correction methods. These error correction methods help ensure the integrity of the received information, thereby ensuring the proper and error free operation of any applications being run on top of the received information, such as, for example, a wireless modem link supporting a remote network node. The problem with the above error correction methods is that they add varying amounts of latency to the data transmission. This latency is due to the processing required in implementing the chosen error correction scheme. Another problem is the fact that the additional error correction code increases the spectrum bandwidth required by a transmission channel (e.g., an RF channel between the transmitting and receiving devices) to transmit the desired information. And yet another problem is the fact that the error correction code requires increased signal processing in both the transmitter and the receiver, thereby increasing power consumption and, in the case of small, portable devices, decreasing battery life.

With most digital transmission systems, there exist several different error correction processes which can be implemented. The error correction processes differ in strength and processor intensiveness. Strength refers to the ability of the error correction process to continue transmitting and receiving data with acceptable error rates in the presence of noise and interference (e.g., noise from the transmitter/receiver hardware, noise from the external environment, noise in the communications channel, etc.). Processor intensiveness refers to the number of processor cycles consumed executing the error correction process (e.g., processor time spent encoding the data on the transmitter side and decoding the data on the receiver side). The stronger error correction processes involve the transmission of increased amounts of redundant error correction code and the use of more sophisticated encoding schemes, and thus, are more processor intensive. When transmission conditions are bad (e.g., large number of errors in the communications channel) the stronger, more processor intensive, error correction processes yield more favorable error rates than weaker, less processor intensive error correction processes.

The more fault intolerant the application with which the digital communication system is used, the stronger, and hence, more processor intensive, the error correction process is required to be. Thus, for example, in applications such as distributed computer networks applications which require the accurate transmission of large amounts of data to the various distributed computer nodes, extremely strong error correction processes are used. The strong error correction is highly processor intensive, and hence, adds a significant amount of latency, spectrum bandwidth and power to the communication system. In other applications, such as, for example, voice based telephony, the presence of errors in the data (e.g., digitized voice) does not significantly impair performance of the application. Most people can understand voice communication with small to moderate amounts of noise (e.g., data errors). However, most people are very much annoyed by latency in the communications system. Thus, in voice applications, faster error correction processes are required.

Accordingly, the power and the amount of error correction used is typically chosen such that the communications system or the application being served by the communications system will run satisfactorily under average operating conditions. If a greater degree of reliability is required, stronger, high latency error correction routines are used. If low latency is required, fast executing error correction is used.

The problem, however, is the fact that in most cases these error correction methods are static. They are typically chosen during the design process of the communications system. A static error correction method is chosen and designed into a communications system in accordance with the typical expected operating conditions of the system. Static error correction is, in this manner, a design compromise based upon the expected use of the system. For example, in a communication system which can be used for both voice and data applications (e.g., voice based telephony and fax transmission, file transfer and internet access).

The type of user data transferred using the communications system is typically unknown, or alternatively, selected by the user. In the case where the type of data typically transferred is not determined (i.e., unknown), assumptions about the data type are built into the device at the time of its manufacture, which accordingly tend to dictate the primary use of the device.

In the case of user selection, the user specifies which error correction process to use by specifying the type of data (e.g., voice or fax or file transfer or internet access) is to be transferred. The disadvantage with the user selected data type scheme is that the user may neglect to enter such information to the communication system or may make mistakes when doing so. If the incorrect data type is selected, the communications system operates using wrong or sub-optimal error correction methods for data transmission and error handling.

Because of these difficulties, the choice of error correction processes that can be used are often reduced so that even a signal having the tightest restrictions on a certain feature can successfully be transmitted and received even when wrong type information has been entered. In essence, the communications system uses error correction processes which are able to guarantee successful transmission even where the data type is incorrectly assigned. This leads to a loss of received signal quality or fidelity, a waste of spectrum or bandwidth for the transmission, which in turn leads to reduced population density that can be served by the communications system and decreased system efficiency (e.g., increased disturbance for wireless systems, least increased cost for a given transmission, and the like).

Thus, what is required is a system which automatically tailors the error correction technique to the type of data being transmitted. What is required is a system which accurately detects the type of user data in the transmission channel of a communications system and correctly selects the most appropriate error correction process for that data. What is required is a solution that selects and implements error correction processes based upon the type of user data in such a manner that the performance of the communications system is optimized in accordance with the user data type. The present invention provides a novel solution to the above requirements.

DISCLOSURE OF THE INVENTION

The present invention provides a system which automatically tailors the error correction technique to the type of data being transmitted. The present invention provides a system which accurately detects the type of user data in the transmission channel of a communications system and correctly selects the most appropriate error correction process for that data. Additionally, the present invention provides for the selection and implementation of error correction processes based upon the type of user data being transmitted through a communications channel in such a manner that the performance of the communications system is optimized in accordance with the user data type.

In one embodiment, the present invention comprises a dynamic error correction system for a digital data transmission system. The data transmission system includes a transmitter adapted to encode user data using one of several encoding-error correction techniques. The transmitter is further adapted to transmit the resulting signal to a receiver via a transmission channel (e.g., wireless RF link, cable, etc.). The transmitter also includes a data type detector coupled to sample the user data. The data type detector is adapted to determine the data type of the user data, wherein the determined data type is used to select the most appropriate encoding-error correction technique for use.

The data type detector detects the type of user data by tentatively regarding the signal as an encoded analog data stream, extracting certain features, and checking these features against various possibilities. Such features can be the power spectral density of a sequence of data samples, or their self-correlation function. Characteristic properties are used to distinguish voice data (e.g., speech) from analog modem data and random data.

The transmitter subsequently encodes the user data in accordance with the user data's data type. In the case of real time voice user data (e.g., as in telephone voice communication), fast executing, fast implementing encoding-error correction is used to minimize the latency imposed. In the case of computer readable user data (e.g., networked computer application data or fax data), more robust, more accurate encoding-error correction is used since these types of applications are more fault intolerant.

The receiver receives the resulting signal via the transmission channel and determines the type of encoding-error correction employed from information included within a control information channel included within the transmission channel. The receiver decodes the signal using a decoder corresponding to the encoder used by the transmitter, to obtain the user data. In this manner, present invention provides for the selection and implementation of error correction processes based upon the type of user data being transmitted through a communications channel in such a manner that the performance of the communications system is optimized in accordance with the user data type. This conserves both power used by the transmitter and spectrum bandwidth of the transmission channel.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, a method and system for detection user data types in digital communications channels and optimizing encoding-error correction in response thereto, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not unnecessarily to obscure aspects of the present invention.

The present invention provides a system which automatically tailors the error correction technique to the type of data being transmitted. The present invention provides a system which accurately detects the type of user data in the transmission channel of a communications system and correctly selects the most appropriate error correction process for that data. Additionally, the present invention provides for the selection and implementation of error correction processes based upon the type of user data being transmitted through a communications channel in such a manner that the performance of the communications system is optimized in accordance with the user data type. The present invention and its advantages are further described below.

Figure 1:
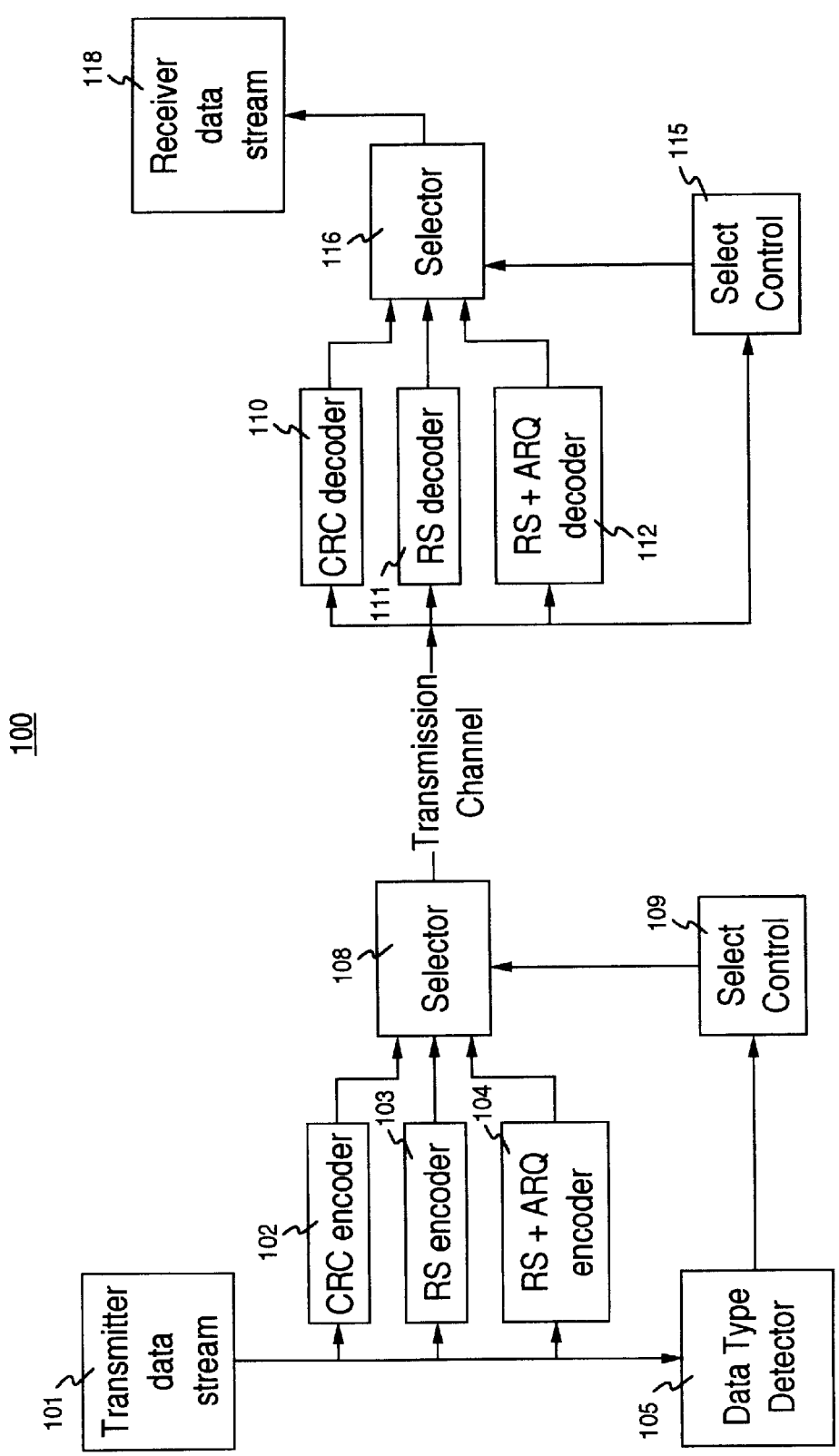
FIG. 1 shows a communication system in accordance with one embodiment of the present invention.

Referring now to FIG. 1, a digital communications system 100 in accordance with one embodiment of the present invention is shown. System 100 is a communications system including a transmitting device and a receiving device. The components of the transmitting device are on the left side of FIG. 1 and the components of the receiving system are on the right side.

Within the transmitting device, a transmitter data stream source 101 is coupled to a CRC encoder 102, an RS encoder 103 and an RS+ARQ encoder 104. Encoders 102–104 function by encoding the information from transmitter data stream 101 with their respective encoding-error correction techniques. Each of encoders 102–104 is designed for a specified level of encoding and/or error correction capability. CRC encoder 102 is a cyclic redundancy check encoder. RS encoder 103 is a Reed-Solomon encoder. RS+ARQ is a Reed Solomon encoder with Automatic Repeat Request capabilities. Each of the encoders 102–104 are coupled to a selector 108. Selector 108 is coupled to corresponding decoders 110–112 (CRC decoder 110, RS decoder 111, and RS+ARQ decoder 112) in the receiving device via a transmission channel 113. Decoders 110–112 are each coupled to a selector 116, which is in turn coupled to a receiver data stream 118 within the receiving device. In the present embodiment, selector 108 and selector 116 function as switches and are respectively controlled by a select control 109 and a select control 115.

A data type detector 105 is coupled to receive information from the transmitter data stream 101. In accordance with the present invention, data type detector 105 is adapted to determine the data type of the information (e.g., user data) from transmitter data stream 101. Depending upon the type of the user data, data type detector 105 selects the most optimal encoding and/or error correction process (e.g., CRC decoder 110, RS decoder 111, or RS+ARQ decoder 112) with which to encode the user data.

Referring still to FIG. 1, system 100 functions by transmitting user data from transmitter data stream 101 to receiver data stream 118 via transmission channel 113. In accordance with the present invention, system 100 dynamically selects the encoding and/or error correction technique used for transmission and reception depending upon the user data type.

It should be appreciated that error correction is not always employed by system 100. For example, encoders 103 and 104 utilize encoding techniques which include error correction, however, encoder 102 utilizes an encoding technique including error detection as opposed to error correction. As such, it should be appreciated that as referred to hereafter, the term encoding-error correction refers to encoding techniques which include error correction and/or error detection and/or mere compression, or other well known information encoding techniques.

In accordance with the present embodiment, selector 109 selects one of encoders 102–104 to provide the signal for transmission channel 113, and in turn, to the receiving device. The selected encoder encodes the user data from transmitter data stream 101 using its respective encoding-error correction technique. At the receiving device, the signal is decoded in accordance with which encoding error correction technique had been utilized in the transmitter. Information regarding the selected encoding-error correction technique employed by the transmitter is embedded within the signal in the transmission channel 113, and using this information, select control 115 selects a corresponding decoder (e.g., one of decoders 110–112) to decode the signal. Selector 116 couples the resulting output to receiver data stream 118.

As described above, select control 109 in the transmitter device determines which encoder to use based upon the user data type received from data type detector 105. Within data type detector 105, the type of the user data from transmitter data stream 101 is detected by tentatively regarding the signal from transmitter data stream 101 as an encoded analog data stream, extracting features from that signal, and checking these features against various possibilities. Such features include, for example, the power spectral density of a sequence of data samples, the self-correlation function of a sequence of samples, or the like. For example, the data type detector can be adapted to implement a correlation function wherein the data type is determined by comparing a series of samples of the user data with sets of stored predetermined samples of various representative user data types.

In a case where system 100 is implemented within a modem device, the characteristic properties of the speech and analog modem data are distinguishable from each other and from random data. In order to make a decision regarding the detected data type, data type selector 105 compares those features with certain expected values, or even a larger set of previously derived feature samples, during a training phase. These expected values or feature samples are predetermined and are typically incorporated in system 100 during manufacture. It should be noted that there exist several classification algorithms that have been developed for pattern recognition purposes and that can be implemented in data type detector 105.

Consequently, the user data from transmitter data stream 101 is encoded in accordance with its data type. Thus, user data types which are very latency intolerant utilize correspondingly fast encoding-error detection, while user data types which are very fault intolerant utilize correspondingly strong encoding-error correction. In this manner, system 100 dynamically adjusts the encoding-error correction technique used in response to the user data type, thereby achieving optimal efficiency regardless of the type of user data being transmitted.

With reference still to FIG. 1, each of the error correction techniques employed by encoders 102–104 are well known and widely used. The CRC technique employed by encoder 102 is the least powerful of the three, in that it imposes the lowest signal processing load on the transmitting device and the receiving device, imposes the lowest degree of signal processing delay and latency, and is thus suited for use with applications which cannot tolerate latency or delay (e.g., a telephone conversation). The RS technique employed by encoder 103 imposes a relatively higher signal processing load and provides more robust error correction than CRC, and is thus suited for use when the application is more sensitive to errors or faults.

The RS+ARQ technique employed by encoder 104 is more robust capability wise than both CRC and RS. Accordingly, RS+ARQ provides a very high degree of accuracy. However, RS+ARQ imposes higher signal processing loads than either CRC or RS, and imposes much higher signal processing delay and latency. Hence, RS+ARQ is best suited for use in applications which are very fault intolerant (e.g., data transmission for important computer applications).

It should also be noted that the dynamic optimization of the encoding-error correction technique utilized based upon the user data type also optimizes the use of spectrum, signal processing, and battery power. The more robust encoding-error correction techniques (e.g., RS+ARQ) require more processor cycles for implementation, and are thus, more power consuming. The more robust encoding-error correction techniques also require the transmission of more redundant error correction code for their implementation, thereby increasing the spectrum bandwidth requirements for the transmission channel.

The attributes of the particular techniques (e.g., CRC, RS, RS+ARQ) are summarized in Table 1 and the legends for the terms used in the discussions herein are summarized in Table 2 below.

tion at both ends (e.g., cell phones) of the transmission channel can significantly impair the comprehensibility of communication. Some degree of noise (e.g., due to errors in transmission) in the communication is less impairing than large amounts of latency. Hence, for most voice applications, the fast encoding-error detection methods are used (e.g., CRC).

Although system 100 is depicted with three encoder-decoder pairs, it should be appreciated that the present invention is suited to use with any number of decoder-encoder pairs (e.g., 2 or more), representative of a wide variety of encoding-error correction techniques.

It also should be noted that the data type detector periodically reassesses and dynamically updates the detected user data type, and so notifies select control 109, on a regular basis during operation. In addition, it should also be appreciated that, in accordance with the present embodiment, system 100 is shown using DECT defined (digital enhanced cordless telephony) encoding-error correction methods. However, it should be appreciated that the system of the present invention is well-suited for use with other types of digital communication systems.

It should be appreciated that the system of the present invention can be implemented mostly in software executing

TABLE 1

| Detected signal type | Selected Method (ETSI) | Error Detection Method | Error Correction Method | Bandwidth [kbit/s] | Signal processing effort | Signal processing delay | Error correction capability |
|---|---|---|---|---|---|---|---|
| Speech | LU1 | | | 32 | Medium | Low | None |
| Audio | LU5(lp) | CRC | | 64 + 16 | Low | Very Low | None |
| Video/Modem/Fax Data | LU8 | | RS | 64 + 4.8 | High | Low | Good |
| Random/file transfer/internet access | LU7 | CRC | RS + ARQ | 64 + 1.6 + 4.8 + 8 | Higher | Very high | Very Good |

TABLE 2

| LU | Link Usage protocol, as per ETS 300 175-4 or ETS 300 822 |
| CRC | Cyclic Redundancy Check: calculating local check sum and comparing to transmitted check sum to detect errors in received data |
| RS | Reed-Solomon block code forward error correction: using redundancy in the transmitted data to detect and remove errors in received data |
| ARQ | Automatic Repeat reQuest: asking for re-transmission of data received with uncorrectable errors. |

Thus, as shown by Table 1, the more powerful error correction methods that are employed for more critical data lead to an increase in transmission delay time. This is caused by additional signal processing required to remove data errors (in case of forward error correction) or even asking for re-transmission in cases where interference is more severe. For most computer application type data transmissions, this effect does not significantly impair the application's performance.

However, in the case of a cellular communication, for example, latency and delay during transmission and recepon, for example, an embedded DSP system, as hardware implemented in one or more ASICs (application specific integrated circuits), or a combination of the two. For example, although system 100 of FIG. 1 is depicted as discrete logic blocks, each or any one of these blocks can be implemented in software which executes on a digital signal processor, or as a hardware entity in an ASIC. More robust error correction techniques require more significant processor capacity. For example, the RS technique requires very significant processor bandwidth for execution in real-time. As such, it is common for the RS error correction routines to be implemented as ASIC hardware blocks, thereby increasing the speed and responsiveness of the communications system.

For example, in the case of a typical DECT voice communication systems, the encoding-error correction routines and the other components shown in FIG. 1 are implemented as software functions which execute on an embedded DSP system, while the more processor intensive error correction routines execute within specialized hardware accelerators coupled to the DSP.

Figure 2:
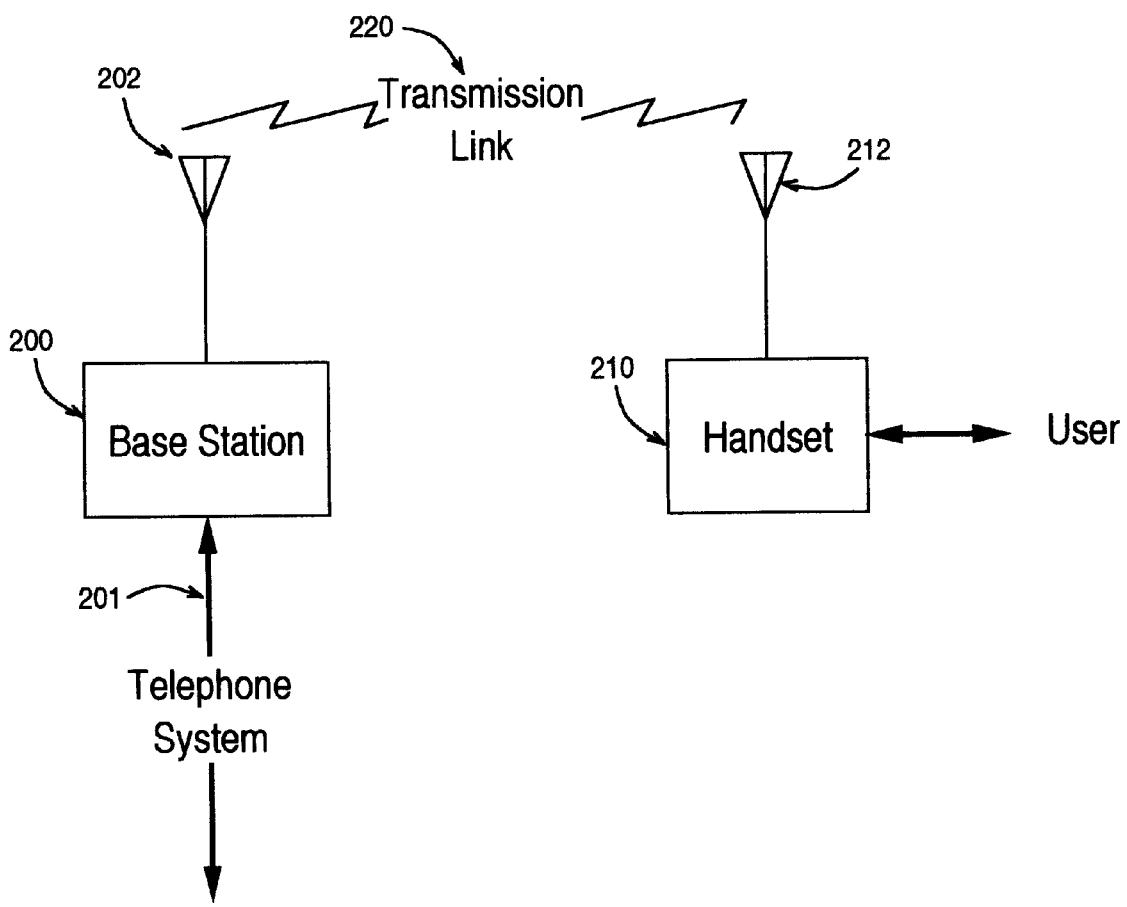
FIG. 2 shows a typical wireless telephone application of the communication system of FIG. 1.

Referring now to FIG. 2, a diagram of an example application of system 100 is shown. FIG. 2 shows a wireless telephone base station and a corresponding telephone handset 210. Base station 200 is coupled to the local telephone exchange via a telephone line 201 (e.g., local loop telephone outlet). Base station 200 communicates with handset 210 via antenna 202 and antenna 212. Handset 210 is a portable wireless handset used for both voice and data communication. Handset 210 communicates with base station 200 via a transmission link 220. As shown in FIG. 2, transmission link 220 includes both transmission channel 113 and feedback channel 114 of FIG. 1, base station 200 includes components 101–109, and handset 210 includes components 110–118.

During operation, system 100 functions by dynamically implementing the optimum error correction technique as suited to the user data type. Thus, as described above, during voice applications (e.g., the user places a telephone call) fast CRC encoding-error detection is used. During data applications, (e.g., the user faxes a document from a portable computer coupled to the handset) RS or RS+ARQ encoding/error correction is used.

It should be noted that with system 100, many variations and many modifications in accordance with the particular requirements of a user are possible. Such modifications and such requirements may be necessary depending upon the specific circumstances and conditions in which the system of the present invention is to operate and any particular purpose to which the present invention is applied. As such, it is intended that such modifications are within the scope of the present invention.

Figure 3:
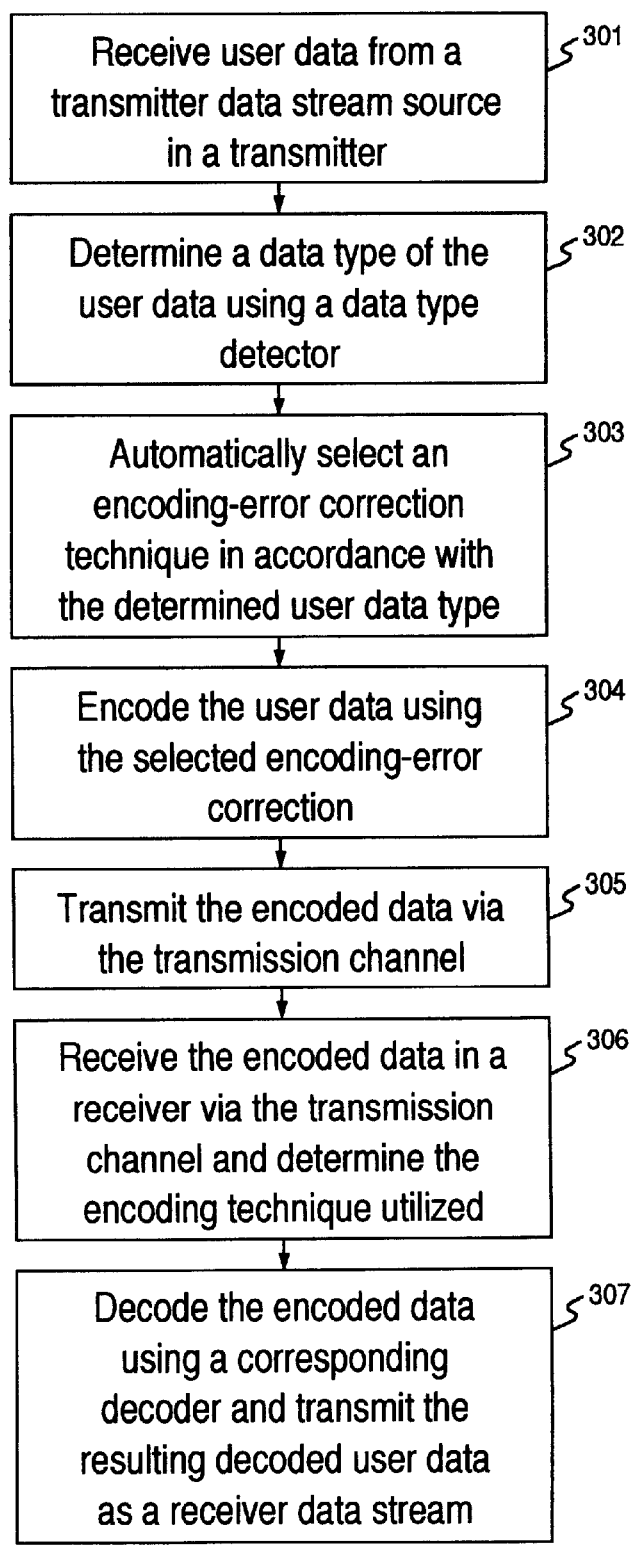
FIG. 3 shows a flow chart of the steps of an operating process in accordance with one embodiment of the present invention.

FIG. 3 shows a flow chart of a process 300 in accordance with one embodiment of the present invention. Process 300 shows the steps of one typical operating process of a system (e.g., system 100) in accordance with one embodiment of the present invention.

Process 300 begins in step 301 where system 100 of the present invention receives user data from a transmitter data stream source (e.g., transmitter data stream 101). As described above, the user data can be mere voice information (e.g., a telephone call), computer readable data (e.g., a fax), or the like.

In step 302, the data type of the user data is determined using a data type detector (e.g., data type detector 105). As described above, data type detector 105 tentatively regards the user data from transmitter data stream 101 as an encoded analog data stream, and extracts several features (e.g., samples) therefrom. These features are compared with various sets of predetermined expected values during a training phase. During this phase, the distinguishing characteristics of either voice data, fax data, etc., are observed. The observation of these distinguishing characteristics allow a decision to be made as to the data type of the user data. As described above, there exist several classification algorithms that can be implemented in data type detector 105.

In step 303, system 100, as determined by data type of the user data, automatically selects an encoding-error correction technique for encoding the user data. As described above, a select control (e.g., select control 109) selects an encoding-error correction technique for implementation in accordance with the data type from the data type detector 105. The transmitter includes at least two encoding-error correction encoders. As described above, applications which are latency intolerant (e.g., real time voice communication) use fast executing encoding-error correction, while applications which are fault intolerant (e.g., remote computer applications) use more robust and more accurate encoding-error correction.

In step 304, the transmitter encodes the user data using the selected encoding-error correction. As determined by select control 109, a selected encoder (e.g., one of encoders 102–104) encodes the user data and couples the user data to a selector (e.g., selector 108).

In step 305, the resulting encoded user data is transmitted via the transmission channel. As described above, information regarding the user data type and the specific encoding-error correction technique used by the transmitter is transmitted to the receiver via a portion of the transmission channel, typically referred to as the control information channel.

In step 306, the encoded data is received in the receiver via the transmission channel and the encoding technique used by the transmitter is determined.

In step 307, the encoded data is decoded using a decoder corresponding to the encoder used by the transmitter. The resulting decoded user data is then transmitted as the receiver data stream (e.g., receiver data stream 118).

Thus, the present invention provides a system which automatically tailors the error correction technique to the type of data being transmitted. The present invention provides a system which accurately detects the type of user data in the transmission channel of a communications system and correctly selects the most appropriate error correction process for that data. Additionally, the present invention provides for the selection and implementation of error correction processes based upon the type of user data being transmitted through a communications channel in such a manner that the performance of the communications system is optimized in accordance with the user data type. The present invention and its advantages are further described below.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the claims appended hereto and their equivalents.

What is claimed is:

1. A system for implementing dynamic encoding-error correction in a digital data transmission system, comprising:

a transmitter adapted to encode user data into a signal;

a receiver adapted to receive said signal and decode said user data encoded thereon, wherein said signal is transmitted from said transmitter to said receiver via a communications channel;

a data type detector coupled to said transmitter, said data type detector adapted to detect a data type of said user data to be transmitted from said transmitter by observing said user data;

a processor coupled to said transmitter, said processor adapted to implement at least a first encoding-error correction process and a second encoding-error correction process for said transmitter, wherein said second encoding-error correction process is of a higher capability than said first encoding-error correction process; and said processor coupled to receive said data type from said data type detector and dynamically select said first encoding-error correction process or said second encoding-error correction process in response thereto such that encoding-error correction employed by said transmitter matches said data type of said user data.

2. The system of claim 1, wherein said first encoding-error correction process is adapted to impose less latency than said second error correction process.

3. The system of claim 1 wherein said processor includes a first hardware based encoder for implementing said first encoding-error correction process and a second hardware based encoder for implementing said second encoding-error correction process.

4. The system of claim 1, wherein said data type detector is adapted to determine said data type of said user data by implementing a pattern recognition algorithm to recognize distinguishing characteristics between a plurality of different types of user data.

5. The system of claim 1, wherein said data type detector is adapted to determine said data type of said user data by regarding said user data as analog data and extracting signal features therefrom.

6. The system of claim 5, wherein said data type detector is adapted to compare said signal features to a plurality of predetermined stored samples to determine said data type.

7. The system of claim 5, wherein said signal features include power spectral density of said user data.

8. The system of claim 5, wherein said signal features include phase spectrum of said user data.

9. The system of claim 5, wherein said data type detector is adapted to implement a correlation function wherein said data type is determined by comparing a plurality of samples of said user data with predetermined stored samples from representative types of user data.

10. The system of claim 1, wherein said first encoding-error correction process or said second encoding-error correction process is dynamically selected in response to said data type of said user data such that spectrum bandwidth of said transmission channel is conserved.

11. The system of claim 1, wherein said first encoding-error correction process or said second encoding-error correction process is dynamically selected in response to said data type of said user data such that battery power of said transmitter is conserved.

12. A system for implementing dynamic encoding-error correction in a DECT (digital enhanced cordless telephony) based digital data transmission system, comprising:
 a transmitter adapted to encode user data into a signal;
 a receiver adapted to receive said signal and decode said user data encoded thereon, wherein said signal is transmitted from said transmitter to said receiver via a communications channel;
 a data type detector coupled to said transmitter, said data type detector adapted to detect a data type of said user data transmitted from said transmitter by observing said user data and implementing a pattern recognition algorithm to recognize distinguishing characteristics between a plurality of different types of user data;
 a first encoder coupled to said transmitter adapted to implement a first encoding-error correction process for said transmitter;
 a second encoder coupled to said transmitter adapted to implement a second encoding-error correction process for said transmitter, wherein said second encoding-error correction process is of a higher capability than said first encoding-error correction process and wherein said first encoding-error correction process is adapted to impose less latency than said second error correction process; and
 a select control coupled to said transmitter, said select control coupled to receive said data type from said data type detector and dynamically select said first encoding-error correction process or said second encoding-error correction process in response thereto such that encoding-error correction employed by said transmitter matches said data type of said user data and such that such that battery power of said transmitter is conserved.

13. The system of claim 12 wherein said data type detector, said first encoder, and said second encoder are implemented as software based functions on a digital signal processor system embedded within said transmitter.

14. The system of claim 12, wherein said data type detector is adapted to determine said data type of said user data by regarding said user data as analog data and extracting signal features therefrom.

15. The system of claim 14, wherein said data type detector is adapted to compare said signal features to a plurality of predetermined stored samples to determine said data type.

16. The system of claim 14, wherein said signal features include power spectral density of said user data.

17. The system of claim 14, wherein said signal features include phase spectrum of said user data.

18. The system of claim 14, wherein said data type detector is adapted to implement a correlation function wherein said data type is determined by comparing a plurality of samples of said user data with predetermined stored samples from representative types of user data.

19. The system of claim 12, wherein said first encoding-error correction process or said second encoding-error correction process is dynamically selected in response to said data type of said user data such that spectrum bandwidth of said transmission channel is conserved.

20. In a DECT (digital enhanced cordless telephony) based digital data transmission system, a method for implementing dynamic encoding-error correction, the method comprising the steps of:
 a) transmitting a user data signal from a transmitter to a receiver via a communications channel;
 b) using a data type detector, detecting a data type of user data transmitted from said transmitter by observing said user data and implementing a pattern recognition algorithm to recognize distinguishing characteristics between a plurality of different types of user data;
 c) implementing a first encoding-error correction process for said transmitter using a first encoder coupled to said transmitter;
 d) implement a second encoding-error correction process for said transmitter using a second encoder coupled to said transmitter, wherein said second encoding-error correction process is of a higher capability than said first encoding-error correction process and wherein said first encoding-error correction process is adapted to impose less latency than said second error correction process; and
 e) dynamically selecting said first encoding-error correction process or said second encoding-error correction process in response to said data type of said user data such that encoding-error correction employed by said transmitter matches said data type.

21. The method of claim 20 wherein said data type detector, said first encoder, and said second encoder are implemented as software based functions on a digital signal processor system embedded within said transmitter.

22. The method of claim 20, further including the step of:
 determining said data type of said user data by regarding said user data as analog data and extracting signal features therefrom.

23. The method of claim 22, wherein said data type detector compares said signal features to a plurality of predetermined stored samples to determine said data type.

24. The method of claim 22, wherein said signal features include power spectral density of said user data.

25. The method of claim 22, wherein said signal features include phase spectrum of said user data.

26. The method of claim 22, wherein said data type detector implements a correlation function wherein said data type is determined by comparing a plurality of samples of said user data with predetermined stored samples from representative types of user data.

* * * * *